United States Patent
Sato et al.

(10) Patent No.: US 12,532,705 B2
(45) Date of Patent: Jan. 20, 2026

(54) SUBSTRATE FIXING DEVICE

(71) Applicant: SHINKO ELECTRIC INDUSTRIES CO., LTD., Nagano (JP)

(72) Inventors: Keita Sato, Nagano (JP); Hiroharu Yanagisawa, Nagano (JP); Yohei Yamada, Nagano (JP); Yuichi Nakamura, Nagano (JP); Nobuyuki Iijima, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 777 days.

(21) Appl. No.: 17/573,147

(22) Filed: Jan. 11, 2022

(65) Prior Publication Data
US 2022/0223454 A1    Jul. 14, 2022

(30) Foreign Application Priority Data

Jan. 14, 2021 (JP) .................. 2021-004453
Jun. 23, 2021 (JP) .................. 2021-104338

(51) Int. Cl.
| | |
|---|---|
| H01L 21/683 | (2006.01) |
| B32B 7/02 | (2019.01) |
| B32B 7/027 | (2019.01) |
| B32B 7/12 | (2006.01) |
| H01L 21/687 | (2006.01) |

(52) U.S. Cl.
CPC .... *H01L 21/6833* (2013.01); *H01L 21/68757* (2013.01); *H01L 21/68785* (2013.01); *B32B 7/02* (2013.01); *B32B 7/027* (2019.01); *B32B 7/12* (2013.01); *H01L 21/683* (2013.01)

(58) Field of Classification Search
None
See application file for complete search history.

(56) References Cited

U.S. PATENT DOCUMENTS

| | | | | |
|---|---|---|---|---|
| 5,729,423 A | * | 3/1998 | Donde | H01L 21/6831 361/234 |
| 5,836,618 A | * | 11/1998 | Perlman | G09F 3/04 283/81 |
| 6,475,616 B1 | * | 11/2002 | Dietz | C09D 175/06 428/354 |
| 7,108,909 B1 | * | 9/2006 | Perlman | G09F 3/10 283/81 |

(Continued)

FOREIGN PATENT DOCUMENTS

| | | |
|---|---|---|
| JP | 2007-299837 | 11/2007 |
| JP | 2011-91297 | 5/2011 |

(Continued)

OTHER PUBLICATIONS

Franck, A. "AN002—Pressure Sensitive Adhesives" (undated).*

(Continued)

*Primary Examiner* — Vivian Chen
(74) *Attorney, Agent, or Firm* — Rankin, Hill & Clark LLP (57) ABSTRACT

A substrate fixing device includes: a base plate; an electrostatic adsorption member that adsorbs and holds a substrate; and a first adhesive layer that adhesively bonds the electrostatic adsorption member to the base plate. A storage modulus of the first adhesive layer is not less than 0.01 MPa and not more than 25 MPa within a temperature range of −110° C. to 250° C.

10 Claims, 7 Drawing Sheets

(56) References Cited

U.S. PATENT DOCUMENTS

| | | | |
|---|---|---|---|
| 9,631,128 B2 | 4/2017 | Fujii et al. | |
| 10,414,114 B1 * | 9/2019 | Yoo | B31D 1/021 |
| 2007/0253139 A1 | 11/2007 | Nakano et al. | |
| 2008/0266746 A1 * | 10/2008 | Handa | H01L 21/6831 |
| | | | 361/234 |
| 2010/0156054 A1 | 6/2010 | Sun et al. | |
| 2011/0058303 A1 * | 3/2011 | Migita | H02N 13/00 |
| | | | 156/60 |
| 2011/0096460 A1 | 4/2011 | Yonekura et al. | |
| 2016/0196999 A1 | 7/2016 | Yanoih et al. | |
| 2016/0272848 A1 * | 9/2016 | Suzuki | C09J 7/10 |
| 2017/0092525 A1 | 3/2017 | Sun et al. | |
| 2019/0385883 A1 * | 12/2019 | Yoshikawa | H01L 21/67103 |
| 2020/0312694 A1 * | 10/2020 | Momiyama | H01L 21/67109 |
| 2021/0147720 A1 * | 5/2021 | Torre | C09J 133/066 |
| 2022/0169900 A1 * | 6/2022 | Zhao | B32B 27/288 |
| 2023/0142870 A1 * | 5/2023 | Sato | H01L 21/67103 |
| | | | 279/128 |
| 2024/0209240 A1 * | 6/2024 | Ogata | C08F 290/042 |
| 2024/0339351 A1 | 10/2024 | Momiyama et al. | |

FOREIGN PATENT DOCUMENTS

| | | | |
|---|---|---|---|
| JP | 2012-142413 A | * | 7/2012 |
| JP | 2014-207374 | | 10/2014 |
| JP | 2014-207374 A | * | 10/2014 |
| JP | 2015-061913 | | 4/2015 |
| JP | 2019-220503 | | 12/2019 |
| JP | 2020-023088 | | 2/2020 |
| JP | 2020-023088 A | * | 2/2020 |
| JP | 2020-068219 A | * | 4/2020 |
| JP | 2020-68219 A | | 4/2020 |
| JP | 2020-167404 A | | 10/2020 |
| KR | 2010-0009574 A | * | 1/2010 |
| WO | 2009107701 | | 9/2009 |
| WO | 2016/035878 | | 3/2016 |

OTHER PUBLICATIONS

Japanese Office Action dated Jan. 7, 2025 issued in corresponding Japanese application No. 2021-104338; English machine translation included (8 pages).

* cited by examiner

SUBSTRATE FIXING DEVICE

This application claims priority from Japanese Patent Applications No. 2021-004453, filed on Jan. 14, 2021, and No. 2021-104338, filed on Jun. 23, 2021, the entire contents of which are herein incorporated by reference.

BACKGROUND

Technical Field

The present disclosure relates to a substrate fixing device.

Background Art

In a substrate fixing device used for fixation of a substrate such as a wafer, an electrostatic adsorption member is typically adhesively bonded to a base plate by an adhesive layer (see e.g., WO2016/035878, JP-A-2014-207374, WO2009/107701, JP-A-2011-091297, JP-A-2020-023088, JP-A-2015-061913, JP-A-2019-220503, and JP-A-2007-299837).

The substrate fixing device according to the background art may not be able to obtain sufficient heat uniformity in an adsorption face of the electrostatic adsorption member. In other words, temperature of the adsorption face of the electrostatic adsorption member may vary.

SUMMARY

One of aspects of the present disclosure is to provide a substrate fixing device that can improve uniformity of temperature of an adsorption face of an electrostatic adsorption member.

A certain embodiment provides a substrate fixing device comprising: a base plate; an electrostatic adsorption member that adsorbs and holds a substrate; and a first adhesive layer that adhesively bonds the electrostatic adsorption member to the base plate. A storage modulus of the first adhesive layer is not less than 0.01 MPa and not more than 25 MPa within a temperature range of −110° C. to 250° C.

DESCRIPTION OF EMBODIMENTS

Inventors of the present application have diligently performed investigation in order to look deep into the cause of the variation in the temperature of the adsorption face of the electrostatic adsorption member in the background-art substrate fixing device. As a result, it has been apparent that when the substrate fixing device is exposed to a temperature as low as about −60° C., a large difference may occur between an amount of thermal deformation of the electrostatic adsorption member and an amount of thermal deformation of a base plate to cause large stress to act on the adhesive layer, thereby resulting in occurrence of cohesive failure in the adhesive layer. Due to the occurrence of the cohesive failure, in-plane uniformity of thermal resistance of the adhesive layer is reduced to cause the variation in the temperature of the adsorption face of the electrostatic adsorption member.

The present disclosure has been accomplished based on such a finding to suppress the cohesive failure of the adhesive layer and improve uniformity of the temperature of the adsorption face of the electrostatic adsorption member even when the substrate fixing device is exposed to the low temperature.

Embodiments of the present disclosure will be specifically described below with reference to the accompanying drawings. Incidentally, in description of the present disclosure and the drawings, the same reference signs will be appended to constituent elements having substantially the same functional configurations, so that duplicate description thereof may be omitted.

First Embodiment

Figure 1:
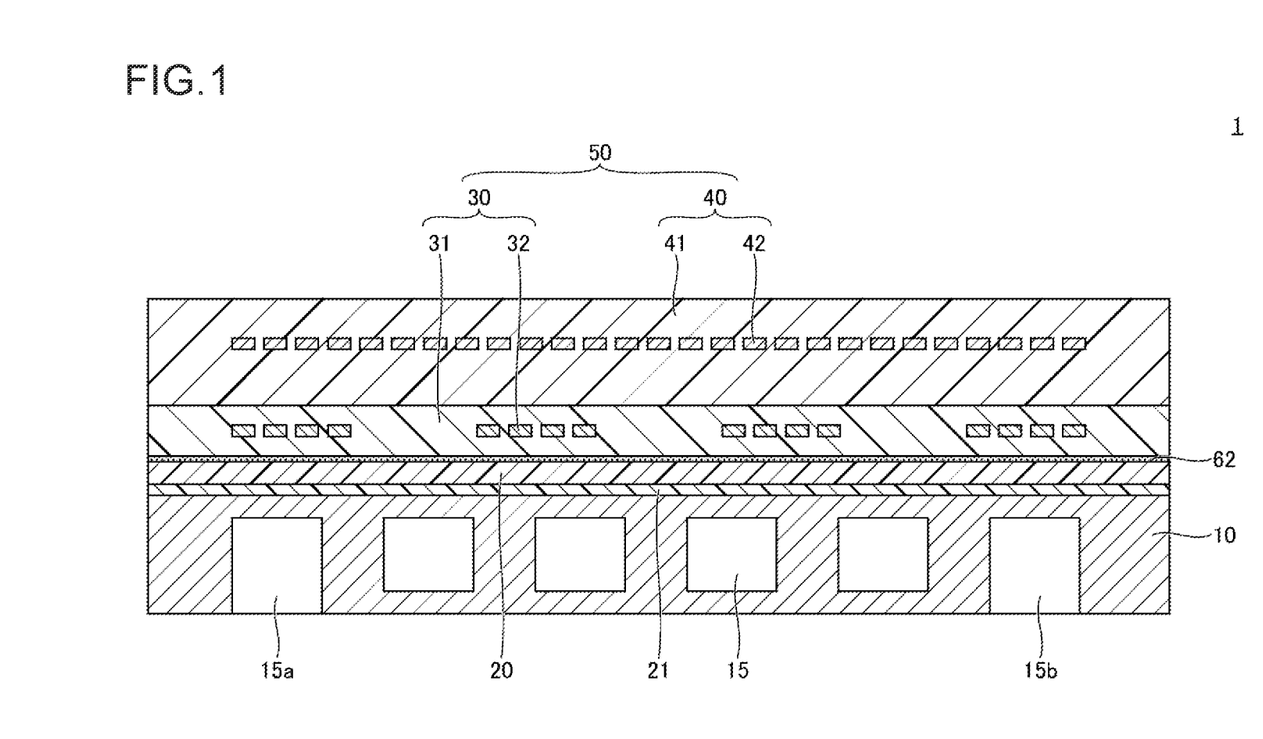
FIG. 1 is a sectional view showing a substrate fixing device according to a first embodiment.

First, a first embodiment will be described. FIG. 1 is a sectional view showing a substrate fixing device according to the first embodiment.

As shown in FIG. 1, the substrate fixing device 1 according to the first embodiment has a base plate 10, an adhesive layer 20, an auxiliary adhesive layer 21, and an electrostatic adsorption member 50 as major constituent elements.

The base plate 10 is a member for mounting the electrostatic adsorption member 50 thereon. Thickness of the base plate 10 can be, for example, set in a range of about 20 mm to 50 mm. The base plate 10 is, for example, formed from aluminum, and can be also used as an electrode or the like for controlling plasma. By feeding predetermined high-frequency electric power to the base plate 10, energy for making ions or the like in a generated plasma state collide against a substrate such as a wafer adsorbed on the electrostatic adsorption member 50 can be controlled to effectively perform an etching process.

A water channel 15 is provided inside the base plate 10. The water channel 15 has one end where a cooling water introduction portion 15a is provided, and the other end where a cooling water discharge portion 15b is provided. The water channel 15 is connected to a cooling water control device (not shown) provided outside the substrate fixing device 1. The cooling water control device (not shown) introduces cooling water into the water channel 15 from the cooling water introduction portion 15a and discharges the cooling water from the cooling water discharge portion 15b. When the base plate 10 is cooled by the cooling water circulated in the water channel 15, the substrate adsorbed on the electrostatic adsorption member 50 can be cooled. In addition to the water channel 15, a gas channel or the like for introducing inert gas to cool the substrate adsorbed on the electrostatic adsorption member 50 may be provided in the base plate 10.

The electrostatic adsorption member 50 having a heating portion 30 and an electrostatic chuck 40 adsorbs and holds the substrate such as the wafer, that is an object to be adsorbed. A primer layer 62 is applied to a face of the electrostatic adsorption member 50 on the base plate 10 side. The primer layer 62 may, for example, contain titanium. The primer layer 62 is an example of a second primer layer.

The heating portion 30 has an insulating layer 31, and a heating element 32 that is built into the insulating layer 31. The heating element 32 is covered with the insulating layer 31 to be protected from the outside. For example, a sintered body of tungsten or molybdenum can be used as the heating element 32. A rolled alloy may be used as the heating element 32. Incidentally, the heating element 32 does not necessarily have to be built into a thicknesswise central portion of the insulating layer 31, and may be unevenly distributed more toward the base plate 10 side or the electrostatic chuck 40 side than the thicknesswise central portion of the insulating layer 31 according to requirement specifications.

For example, an epoxy resin, a bismaleimide-triazine resin, or the like, having high thermal conductivity and high heat resistance can be used as the insulating layer 31. Thermal conductivity of the insulating layer 31 is preferably set to be not less than 3 W/(m·K). By including a filler of alumina, aluminum nitride, or the like, in the insulating layer 31, the thermal conductivity of the insulating layer 31 can be improved. In addition, glass transition temperature (Tg) of the insulating layer 31 is preferably set to be not lower than 250° C. Moreover, thickness of the insulating layer 31 is preferably set in a range of about 100 μm to 150 μm, and a variation in the thickness of the insulating layer 31 is preferably set in a range of +10% or less.

Incidentally, at least one face (one or each of upper and lower faces) of the heating element 32 is preferably roughened in order to improve adhesiveness between the heating element 32 and the insulating layer 31 under high temperature. It is a matter of course that each of the upper and lower faces of the heating element 32 may be roughened. In this case, different roughening methods may be used for the upper face and the lower face of the heating element 32. The roughening methods are not particularly limited, but examples of the roughing methods can include a method using etching, a method using a coupling agent-based surface modification technique, a method using dot processing by a UV-YAG laser having a wavelength of 355 nm or less, and the like.

The electrostatic chuck 40 adsorbs and holds the substrate such as the wafer, which is the object to be adsorbed. A diameter of the substrate, which is the object to be adsorbed by the electrostatic chuck 40, can be, for example, set at about 8 inches, 12 inches, or 18 inches.

The electrostatic chuck 40 is provided on the heating portion 30. The electrostatic chuck 40 has a base body 41, and an electrostatic electrode 42. The electrostatic chuck 40 is, for example, a Johnsen-Rahbek type electrostatic chuck. However, the electrostatic chuck 40 may be a Coulomb force type electrostatic chuck.

The base body 41 is a dielectric. For example, ceramics such as aluminum oxide ($Al_2O_3$) and aluminum nitride (AlN) can be used as the base body 41. Thickness of the base body 41 can be, for example, set in a range of about 1 mm to 10 mm, and a relative dielectric constant of the base body 41 can be, for example, set in a range of about 9 to 10 at a frequency of 1 kHz. The electrostatic chuck 40 and the insulating layer 31 of the heating portion 30 are directly bonded to each other. By directly bonding the heating portion 30 and the electrostatic chuck 40 to each other without any adhesive agent, heat-resistant temperature of the substrate fixing device 1 can be improved. Although heat-resistant temperature of a substrate fixing device in which the heating portion 30 and the electrostatic chuck 40 are bonded to each other by an adhesive agent is about 150° C., the heat-resistant temperature of the substrate fixing device 1 can be set at about 200° C.

The electrostatic electrode 42 that is a thin-film electrode is built into the base body 41. The electrostatic electrode 42 is connected to a power supply provided outside the substrate fixing device 1. When a predetermined voltage is applied to the electrostatic electrode 42, adsorption force caused by static electricity is generated between the electrostatic electrode 42 and the substrate such as the wafer so that the substrate can be adsorbed and held on the electrostatic chuck 40. As the voltage applied to the electrostatic electrode 42 is higher, the adsorption and holding force is stronger. The electrostatic electrode 42 may be a monopolar shape or a bipolar shape. For example, a sintered body of tungsten or molybdenum can be used as the electrostatic electrode 42.

Figure 2:
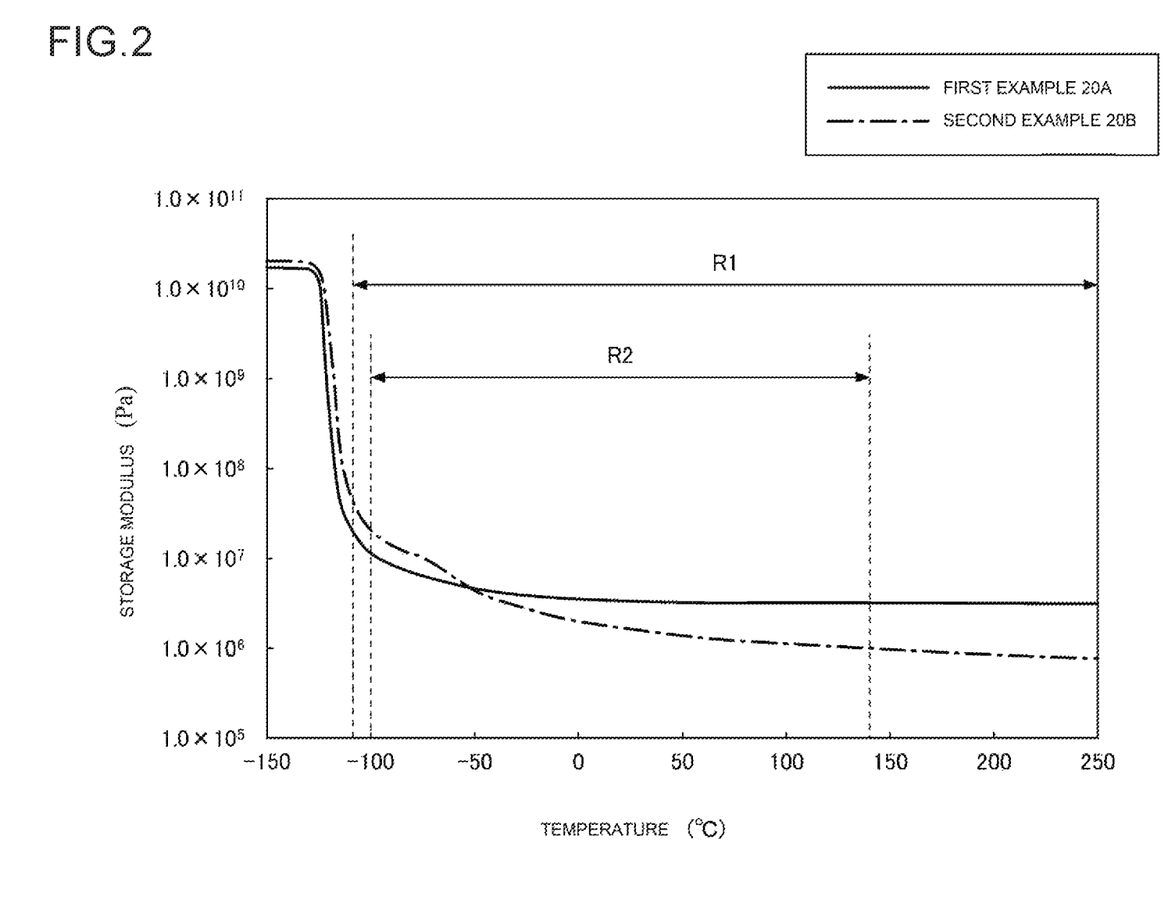
FIG. 2 is a graph showing relationship between temperature and storage modulus in examples of an adhesive layer.

The adhesive layer 20 adhesively bonds the heating portion 30 to the base plate 10. The adhesive layer 20 directly contacts the primer layer 62. For example, a silicone-based adhesive agent can be used as the adhesive layer 20. A filler of alumina, aluminum nitride, or the like may be included in the adhesive layer 20. A storage modulus of the adhesive layer 20 is not less than 0.01 MPa and not more than 25 MPa within a temperature range R1 of −110° C. to 250° C. Preferably, the storage modulus of the adhesive layer 20 is not less than 0.01 MPa and not more than 21 MPa within a temperature range R2 of −100° C. to 140° C. FIG. 2 shows relationship between temperature and storage modulus in each of examples of the adhesive layer 20. The relationship shown in FIG. 2 can be acquired by dynamic mechanical analysis (DMA). FIG. 2 shows characteristics of a first example 20A and a second example 20B of the adhesive layer 20. In each of the first example 20A and the second example 20B, the storage modulus decreases as the temperature increases, and the storage modulus is not more than 25 MPa at −110° C., and is not less than 0.01 MPa and not more than 25 MPa within the temperature range R1. Moreover, in each of the first example 20A and the second example 20B, the storage modulus is not less than 0.01 MPa and not more than 21 MPa within the temperature range R2 of −100° C. to 140° C. In particular, in the first example 20A, the storage modulus is 11 MPa at 100° C., and is not less than 1 MPa and not more than 11 MPa within the temperature range R2. The adhesive layer 20 is an example of a first adhesive layer. Moreover, in the second example 20B, the storage modulus is not less than 0.5 MPa and not more than 21 MPa within the temperature range R2.

Thickness of the adhesive layer 20 is preferably not less than 0.05 mm and not more than 0.4 mm. This is because thermal resistance between the electrostatic chuck 40 and the base plate 10 is likely to be excessive if the thickness of the adhesive layer 20 is more than 0.4 mm. The thickness of the adhesive layer 20 is more preferably not less than 0.05 mm and not more than 0.3 mm, and further preferably not less than 0.05 mm and not more than 0.2 mm. Moreover, from the viewpoint of securing the adhesion force, the thickness of the adhesive layer 20 is preferably not less than 0.05 mm and not more than 0.1 mm.

Within the temperature ranges R1 and R2, thermal conductivity of the adhesive layer 20 is preferably not less than 0.5 W/(m·K) and not more than 10 W/(m·K), and more preferably not less than 0.9 W/(m·K) and not more than 10 W/(m·K). This is because the thermal resistance between the electrostatic chuck 40 and the base plate 10 is likely to be excessive if the thermal conductivity of the adhesive layer 20 is less than 0.5 W/(m·K). Within the temperature ranges R1 and R2, the thermal conductivity of the adhesive layer 20 is further preferably not less than 1.0 W/(m·K) and not more than 10 W(m·K), and further more preferably not less than 1.1 W/(m·K) and not more than 10 W(m·K).

The auxiliary adhesive layer 21 is thinner than the adhesive layer 20. Thickness of the auxiliary adhesive layer 21 is, for example, not less than 0.05 mm and not more than 0.12 mm. Within the temperature ranges R1 and R2, thermal conductivity of the auxiliary adhesive layer 21 is preferably higher than the thermal conductivity of the adhesive layer 20. For example, within the temperature ranges R1 and R2, the thermal conductivity of the auxiliary adhesive layer 21 is not less than 2.0 W/(m·K) and not more than 10 W(m·K). The auxiliary adhesive layer 21 is an example of a second adhesive layer.

In the substrate fixing device 1 according to the first embodiment, the storage modulus of the adhesive layer 20 is as low as 25 MPa or less within the temperature range R1 of −110° C. to 250° C. Therefore, even when a large difference has occurred between an amount of thermal deformation of the electrostatic adsorption member 50 and an amount of thermal deformation of the base plate 10, the adhesive layer 20 is easily deformed within the temperature range R1 so that stress acting on the adhesive layer 20 is suppressed. Therefore, cohesive failure of the adhesive layer 20 is suppressed, so that excellent heat uniformity in an adsorption face of the electrostatic adsorption member 50 can be obtained. In other words, uniformity of temperature of the adsorption face of the electrostatic adsorption member 50 can be improved.

Figure 3:
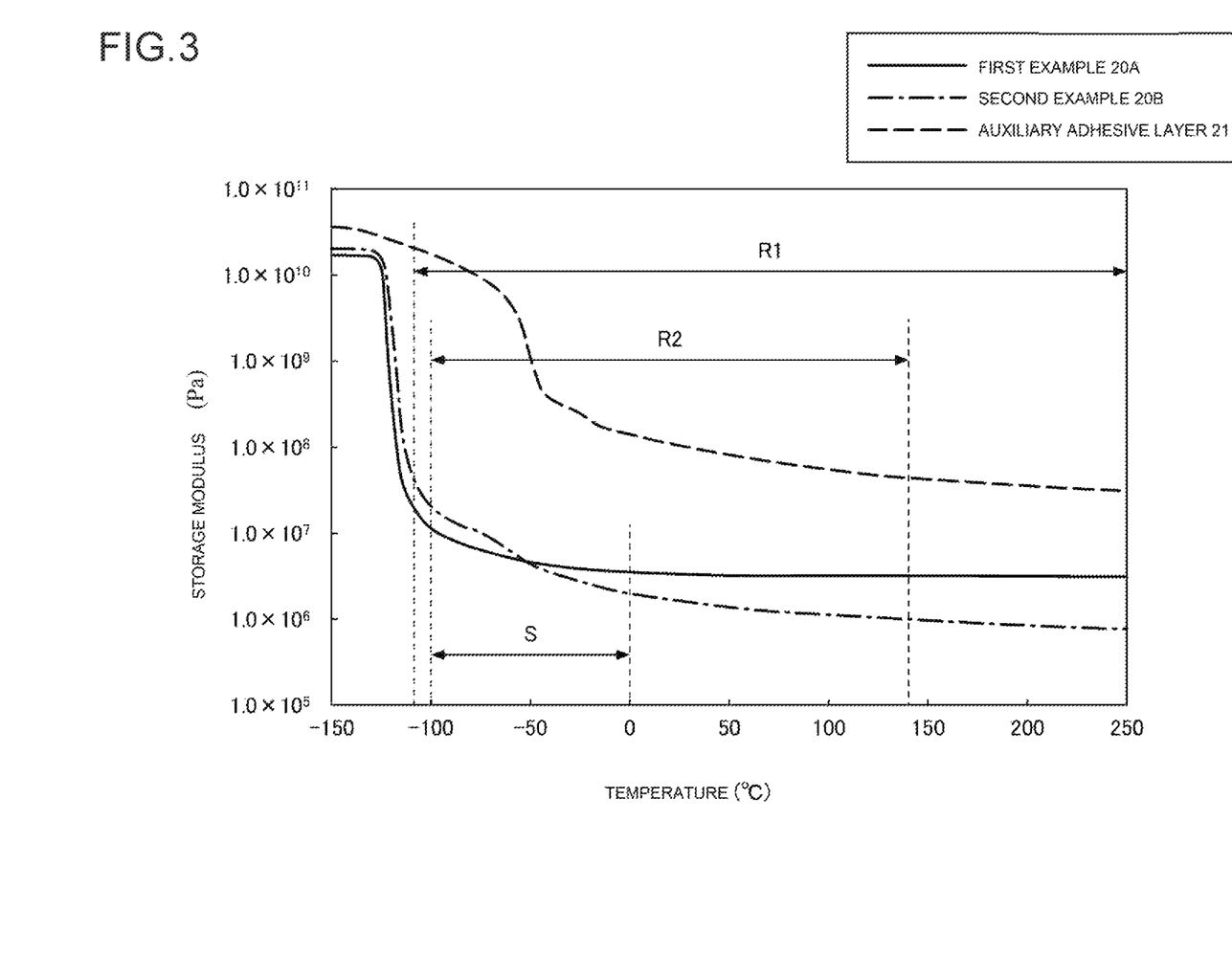
FIG. 3 is a graph showing the relationship between the temperature and the storage modulus in the examples of the adhesive layer and an example of an auxiliary adhesive layer.

Within a temperature range S of −100° C. to 0° C., the storage modulus of the auxiliary adhesive layer 21 is preferably higher than the storage modulus of the adhesive layer 20. This is to easily relax the stress acting on the adhesive layer 20. FIG. 3 shows the relationship between the temperature and the storage modulus in the examples (the first example 20A and the second example 20B) of the adhesive layer 20 and an example of the auxiliary adhesive layer 21. The relationship shown in FIG. 3 can be obtained by DMA. In each of the examples shown in FIG. 3, the storage modulus of the auxiliary adhesive layer 21 is higher than the storage modulus of the adhesive layer 20 within the temperature ranges R1 and R2. That is, the storage modulus of the auxiliary adhesive layer 21 is higher than the storage modulus of the adhesive layer 20 within the temperature range S of −100° C. to 0° C.

The auxiliary adhesive layer 21 and the primer layer (undercoat layer) 62 may not be provided.

Incidentally, in manufacturing the substrate fixing device 1 according to the first embodiment, for example, an adhesive agent whose viscosity is 2 Pa·s to 40 Pa·s can be used as a raw material for the adhesive layer 20. The adhesive agent may be provided by coating, or may use a semi-cured (B-stage) insulating resin film.

Moreover, in manufacturing the substrate fixing device 1 according to the first embodiment, for example, an adhesive agent whose viscosity is 40 Pa·s to 70 Pa·s can be used as a raw material for the auxiliary adhesive layer 21. The adhesive agent may be provided by application, or may use a semi-cured (B-stage) insulating resin film. Grinding may be performed after the adhesive agent is applied and cured.

The substrate fixing device 1 according to the first embodiment can be, for example, manufactured as follows. First, the auxiliary adhesive layer 21 is formed on the base plate 10. Surface grinding may be performed on the auxiliary adhesive layer 21 after the auxiliary adhesive layer 21 has been formed. In addition, the primer layer 62 is applied to a lower face of the electrostatic adsorption member 50 and dried by air. Then, an upper face of the auxiliary adhesive layer 21 and the lower face of the electrostatic adsorption member 50 to which the primer layer 62 has been applied are adhesively bonded to each other by the adhesive layer 20. On this occasion, a spacer may be used to adjust a distance between the base plate 10 and the electrostatic adsorption member 50.

The materials for the adhesive layer 20 and the auxiliary adhesive layer 21 are not limited. Examples of the materials for the adhesive layer 20 and the auxiliary adhesive layer 21 include a silicone resin, an epoxy resin, an acrylic resin, and a polyimide resin. Composite materials based on these resins may be used for the adhesive layer 20 and the auxiliary adhesive layer 21. In addition, a filler may be included in each of the adhesive layer 20 and the auxiliary adhesive layer 21. Examples of the filler include silica, alumina, aluminum nitride, and the like.

Next, a result of a reliability test concerning a substrate fixing device (device No. 1) manufactured in accordance with the first embodiment will be described in comparison with a result of a reliability test concerning a reference example (device No. 2).

The device No. 1 has a first example 20A of an adhesive layer 20 and an auxiliary adhesive layer 21 having characteristics shown in FIG. 3. Thickness of the adhesive layer 20 was set at 0.2 mm, and thickness of the auxiliary adhesive layer 21 was set at 0.1 mm.

Figure 4:
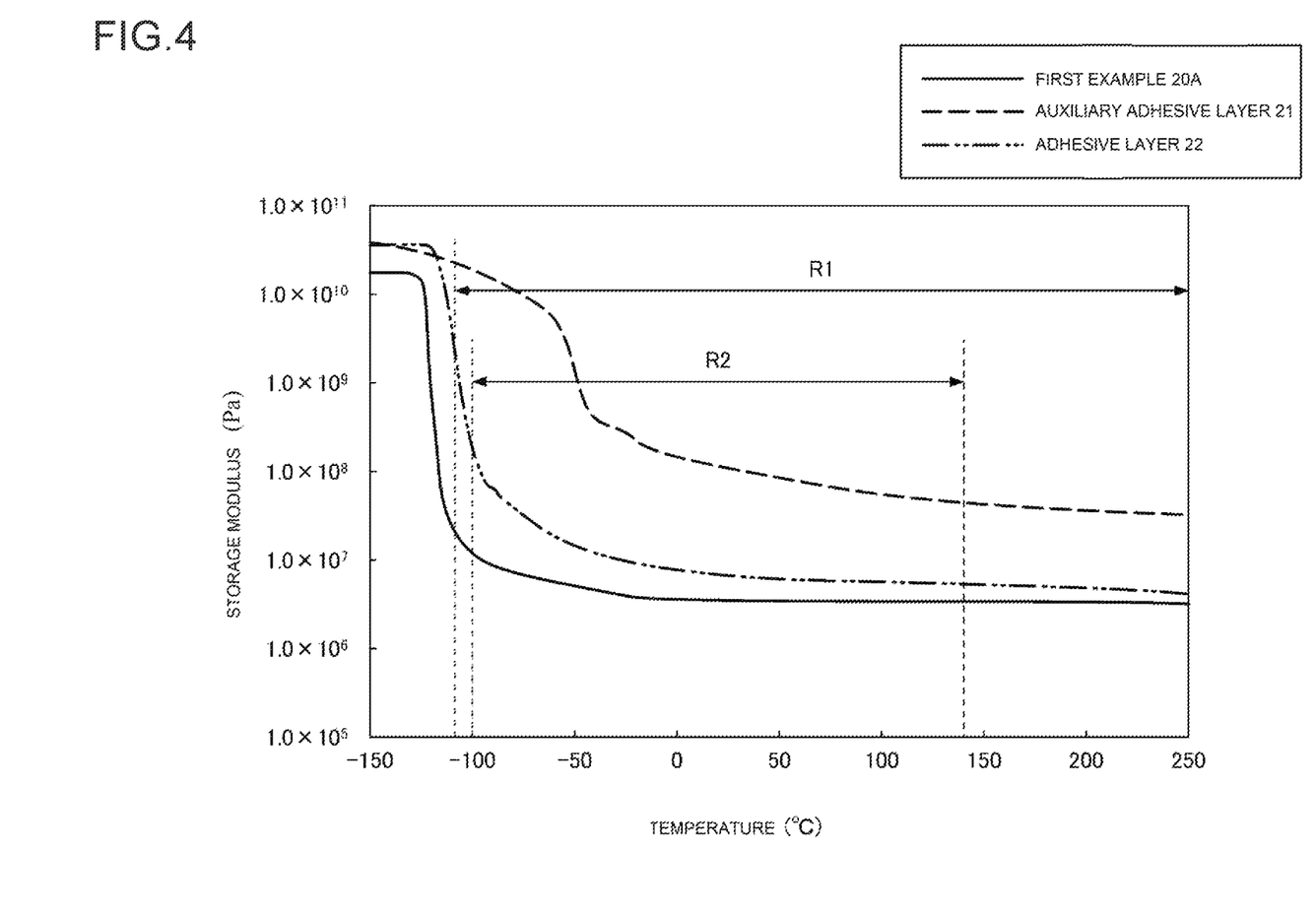
FIG. 4 is a graph showing relationship between temperature and storage modulus in another example of the adhesive layer.

The device No. 2 has an adhesive layer 22 having a characteristic shown in FIG. 4 in place of the first example 20A of the adhesive layer 20. The remaining configuration of the device No. 2 is similar to or the same as the configuration of the Device No. 1. Thickness of the adhesive layer 22 was set at 0.2 mm. FIG. 4 is a graph showing relationship between temperature and storage modulus in another example (the adhesive layer 22) of the adhesive layer. The relationship shown in FIG. 4 can be obtained by DMA.

Incidentally, the adhesive layers 20 and 22 include fillers, and a percentage of the filler content in the adhesive layer 20 (mass of the filler per unit mass of the adhesive layer) is lower than a percentage of the filler content in the adhesive layer 22.

Figure 5:
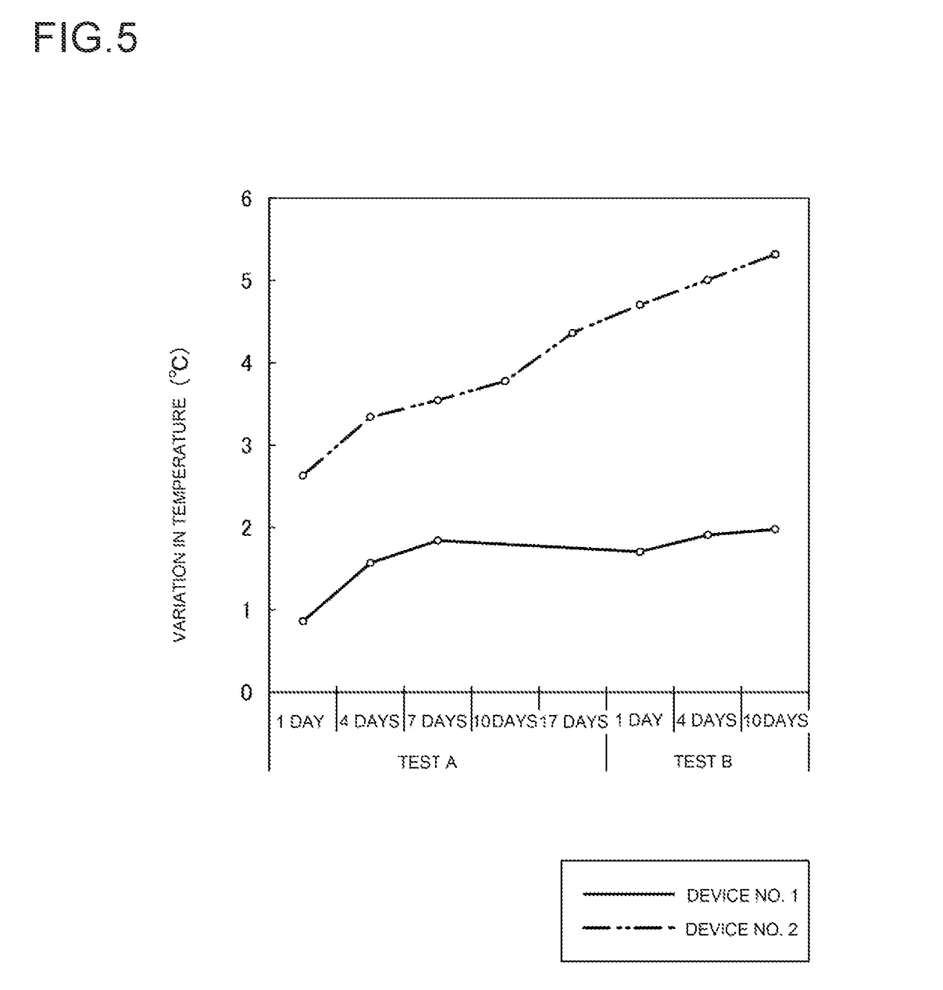
FIG. 5 is a graph showing results of reliability tests.

In the reliability test, repetition of a thermal load of lowering temperature to −45° C. and raising the temperature to 150° C. (test A) and repetition of a thermal load of lowering temperature to −45° C. and raising the temperature to 170° C. (test B) were performed. Then, a variation in temperature of an adsorption face was measured when a predetermined number of days had lapsed since the start of the test. The number of times of the repetition of the thermal load per day in the test A was set at 16, and the number of times of the repetition of the thermal load per day in the test B was set at 11. Results of the tests are shown in FIG. 5. FIG. 5 is a graph showing the results of the reliability tests. In FIG. 5, a horizontal axis shows the number of elapsed days, and a vertical axis shows the variation in the temperature of the adsorption face.

In each of the test A and the test B, as shown in FIG. 5, the variation in the temperature of the adsorption face of the device No. 1 was much smaller than the variation in the temperature of the adsorption face of the device No. 2. This indicates that cohesive failure of the adhesive layer 20 is less likely to occur than cohesive failure of the adhesive layer 22, and that uniformity of thermal resistance of the adhesive layer 20 is excellent over a long period of time.

Incidentally, the surface of the base plate 10 may be insulated by alumina spraying or the like. By the insulating treatment, discharge between the base plate 10 and an electrostatic electrode 42 can be suppressed more surely.

The insulating layer 31 may not be provided, but the heating element 32 may be built into the base body 41 alternatively. Moreover, the heating portion 30 may not be provided in the substrate fixing device 1. In these cases, the adhesive layer 20 adhesively bonds the base body 41 to the base plate 10.

Second Embodiment

Figure 6:
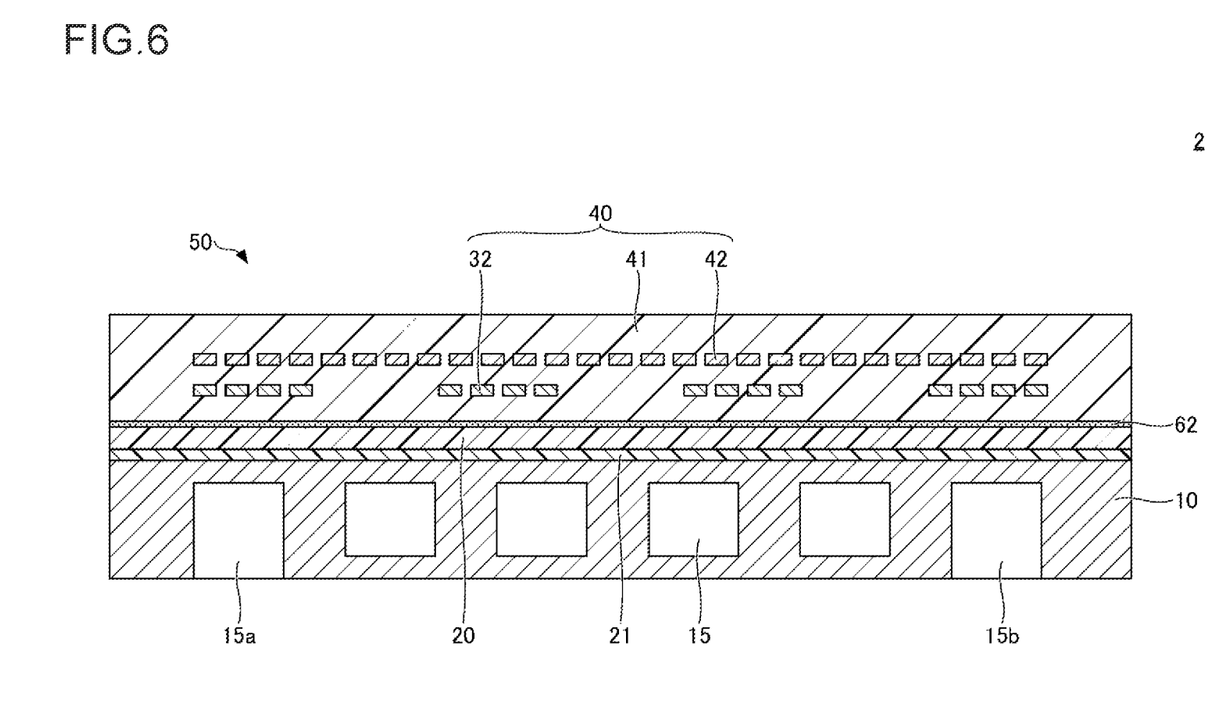
FIG. 6 is a sectional view of a substrate fixing device according to a second embodiment.

Next, a second embodiment will be described. The second embodiment mainly differs from the first embodiment in a configuration of an electrostatic adsorption member. FIG. 6 is a sectional view showing a substrate fixing device according to the second embodiment.

In the substrate fixing device 2 according to the second embodiment, as shown in FIG. 6, the electrostatic adsorption member 50 does not include a heating portion 30, but a heating element 32 is built in an electrostatic chuck 40. The remaining configuration is similar to or the same as that according to the first embodiment.

An effect similar to or the same as that according to the first embodiment can be obtained also by the second embodiment.

Third Embodiment

Figure 7:
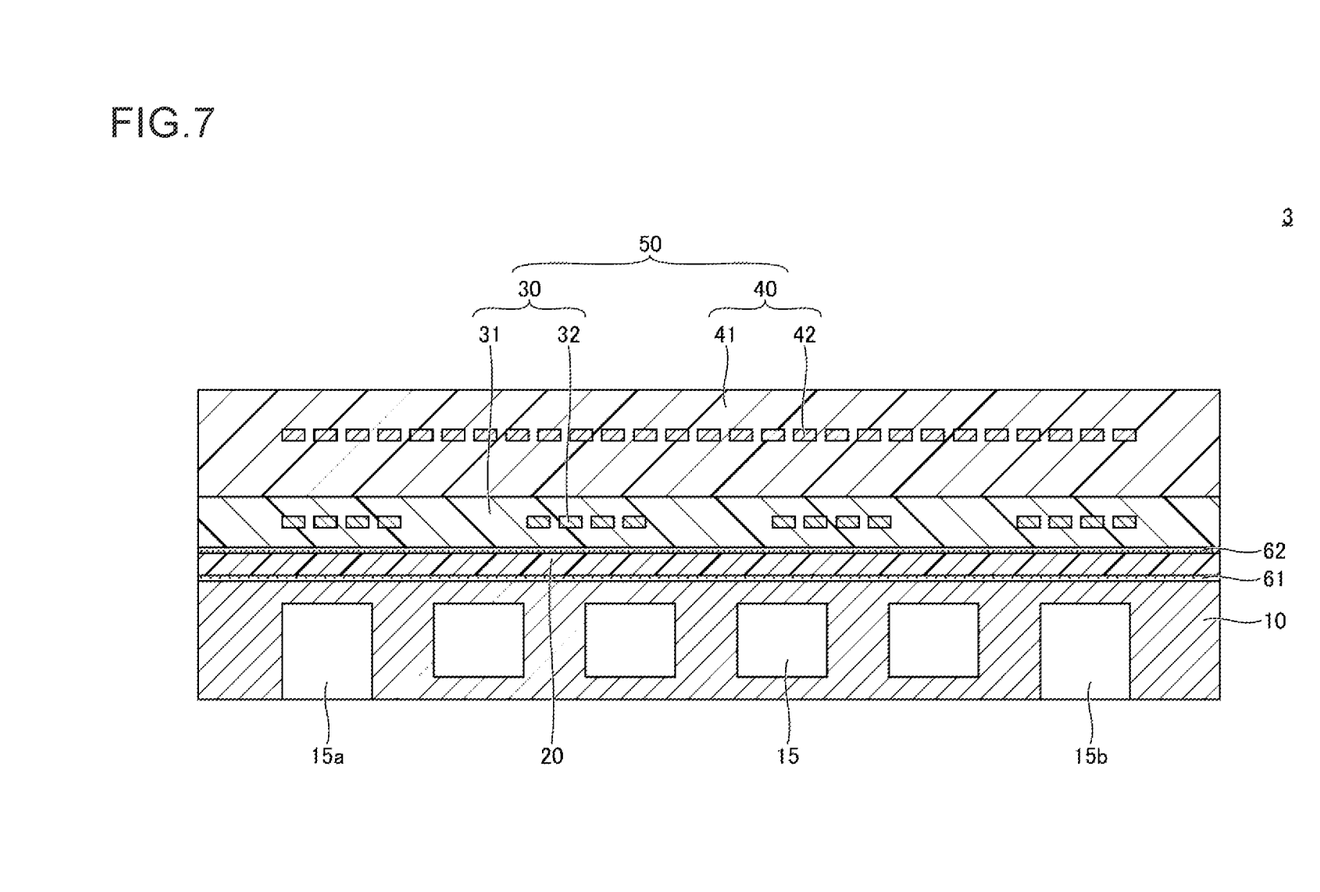
FIG. 7 is a sectional view of a substrate fixing device according to a third embodiment.

Next, a third embodiment will be described. The third embodiment mainly differs from the first embodiment in a configuration of a portion between a base plate 10 and an electrostatic adsorption member 50. FIG. 7 is a sectional view showing a substrate fixing device according to the third embodiment.

In the substrate fixing device 3 according to the third embodiment, as shown in FIG. 7, a primer layer 61 is applied to a face of the base plate 10 on the electrostatic adsorption member 50 side. The primer layer 61 may, for example, contain titanium. The substrate fixing device 3 does not include an auxiliary adhesive layer 21, but an adhesive layer 20 directly contacts the primer layer 61. The remaining configuration is similar to or the same as that according to the first embodiment. The primer layer 61 is an example of a first primer layer.

An effect similar to or the same as that according to the first embodiment can be obtained also by the third embodiment. In addition, since the auxiliary adhesive layer 21 is not provided, thermal resistance between the electrostatic adsorption member 50 and the base plate 10 can be more reduced.

The substrate fixing device 3 according to the third embodiment can be, for example, manufactured as follows. First, the primer layer 61 is applied to an upper face of the base plate 10 and dried. The primer layer 62 is applied to a lower face of the electrostatic adsorption member 50 and dried. The primer layers 61 and 62 may be dried by heating. Then, the upper face of the base plate 10 to which the primer layer 61 has been applied and the lower face of the electrostatic adsorption member 50 to which the primer layer 62 has been applied are adhesively bonded to each other by the adhesive layer 20. On this occasion, a spacer may be used to adjust a distance between the base plate 10 and the electrostatic adsorption member 50.

In the second embodiment, a primer layer 61 may be applied to the face of the base plate 10 on the electrostatic adsorption member 50 side as in the third embodiment, and the auxiliary adhesive layer 21 may not be provided, so that the adhesive layer 20 directly contacts the primer layer 61.

Incidentally, in a thicknesswise direction (up/down direction) of the substrate fixing device 3, the distance between the base plate 10 and the electrostatic adsorption member 50 is preferably not less than 0.025 mm and not more than 1.025 mm, and more preferably not less than 0.050 mm and not more than 1.000 mm. This is to achieve both excellent adhesiveness and heat dissipation. Here, the distance between the base plate 10 and the electrostatic adsorption member 50 is specifically defined by a distance between the upper face of the base plate 10 and the lower face of the electrostatic adsorption member 50.

Although the preferred embodiments etc. have been described above in detail, the present disclosure is not limited to the aforementioned embodiments etc., and various modifications and substitutions can be added to the aforementioned embodiments etc. without departing from the scope described in Claims.

What is claimed is:

1. A substrate fixing device comprising:
    a base plate;
    an electrostatic adsorption member that adsorbs and holds a substrate; and
    a first adhesive layer that adhesively bonds the electrostatic adsorption member to the base plate,
    wherein a storage modulus of the first adhesive layer is not less than 0.01 MPa and not more than 25 MPa throughout a temperature range of −110° C. to 250° C.

2. The substrate fixing device according to claim 1, wherein
    the storage modulus of the first adhesive layer is not less than 0.01 MPa and not more than 21 MPa throughout a temperature range of −110° C. to 140° C.

3. The substrate fixing device according to claim 1, wherein
    thickness of the first adhesive layer is not less than 0.05 mm and not more than 0.4 mm.

4. The substrate fixing device according to claim 3, wherein
    the thickness of the first adhesive layer is not less than 0.05 mm and not more than 0.2 mm.

5. The substrate fixing device according to claim 1, wherein
    a thermal conductivity of the first adhesive layer is not less than 0.5 W/(m·K) and not more than 10 W/(m·K) throughout the temperature range.

6. The substrate fixing device according to claim 1, further comprising:
    a second adhesive layer that is provided between the base plate and the first adhesive layer and thinner than the first adhesive layer,
    wherein a thermal conductivity of the second adhesive layer is higher than a thermal conductivity of the first adhesive layer throughout the temperature range.

7. The substrate fixing device according to claim 6, wherein
    a storage modulus of the second adhesive layer is higher than the storage modulus of the first adhesive layer throughout a temperature range of −100° C. to 0° C.

8. The substrate fixing device according to claim 6, wherein
    a thickness of the second adhesive layer is not less than 0.05 mm and not more than 0.12 mm.

9. The substrate fixing device according to claim 1, wherein the electrostatic adsorption member has an upper face, and a lower face that is opposite to the upper face and faces the base plate, the substrate fixing device further comprises a second primer layer that is provided on the lower face of the electrostatic adsorption member, and the first adhesive layer directly contacts the second primer layer.

10. The substrate fixing device according to claim 1, wherein a distance between the base plate and the electrostatic adsorption member is not less than 0.025 mm and not more than 1.025 mm in a thicknesswise direction of the substrate fixing device.

\* \* \* \* \*